United States Patent
Zappella et al.

(10) Patent No.: US 6,297,069 B1
(45) Date of Patent: Oct. 2, 2001

(54) METHOD FOR SUPPORTING DURING FABRICATION MECHANICAL MEMBERS OF SEMI-CONDUCTIVE DIES, WAFERS, AND DEVICES AND AN ASSOCIATED INTERMEDIATE DEVICE ASSEMBLY

(75) Inventors: Pierino Italo Zappella, Garden Grove; William Richard Fewer, Diamond Bar, both of CA (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/239,469

(22) Filed: Jan. 28, 1999

(51) Int. Cl.[7] .................................................... H01L 21/56
(52) U.S. Cl. ................... 438/53; 438/51; 438/52; 438/127; 438/761; 438/780
(58) Field of Search ................... 438/51, 52, 53, 438/127, 761, 763, 780, DIG. 976, FOR 379, FOR 438, FOR 432; 148/DIG. 159, DIG. 73

(56) References Cited

U.S. PATENT DOCUMENTS

| | | |
|---|---|---|
| 3,758,830 | * 9/1973 | Jackson . |
| 3,994,009 | * 11/1976 | Hartlaub . |
| 4,040,172 | * 8/1977 | Kurtz et al. . |
| 4,275,406 | * 6/1981 | Müller et al. . |
| 4,317,126 | * 2/1982 | Gragg et al. . |
| 4,332,000 | * 5/1982 | Petersen . |
| 4,523,964 | * 6/1985 | Wilner et al. . |
| 4,670,969 | * 6/1987 | Yamada et al. . |
| 4,672,354 | * 6/1987 | Kurtz et al. . |
| 4,744,863 | * 5/1988 | Guckel et al. . |
| 4,808,549 | * 2/1989 | Mikkor et al. . |
| 4,887,248 | 12/1989 | Griebeler . |
| 4,889,590 | * 12/1989 | Tucker et al. . |
| 5,091,288 | 2/1992 | Zappella et al. . |
| 5,177,661 | * 1/1993 | Zavracky et al. . |
| 5,475,318 | 12/1995 | Marcus et al. . |
| 5,518,964 | 5/1996 | DiStefano et al. . |
| 5,578,528 | 11/1996 | Wuu et al. . |
| 5,604,144 | * 2/1997 | Kurtz . |
| 5,620,933 | 4/1997 | James et al. . |
| 5,642,015 | 6/1997 | Whitehead et al. . |
| 5,665,249 | 9/1997 | Burke et al. . |
| 5,665,648 | 9/1997 | Little . |

* cited by examiner

Primary Examiner—George Fourson
Assistant Examiner—Joannie Adelle Garcia
(74) Attorney, Agent, or Firm—Kris T. Fredrick

(57) ABSTRACT

A method is provided for supporting the mechanical members of a micro-electronic substrate during the manufacture of the substrate into a micro-mechanical or micro-electromechanical device. The method provides supporting material that surrounds the various mechanical members of the micro-electronic substrate and stabilizes these mechanical members during manufacture. The method also facilitates precise photolithographic as well as other microfabrication techniques. Specifically, the method provides support material that surrounds the perimeter of the micro-electronic substrate and that has a surface that is coplanar with one surface of the micro-electronic substrate. Photoresist or other materials can then be deposited, such as by spinning, on the surface of the micro-electronic substrate such that the edges of the photoresist or other materials lie upon the supporting material. By placing the outer edges of the photoresist or other material on the surface of the support material, the surface of the micro-electronic substrate remains planar for subsequent photolithographic or other microfabrication procedures. An intermediate micro-electronic device assembly is also provided in which a mechanical member, such as a membrane, is supported by the supporting material.

21 Claims, 5 Drawing Sheets

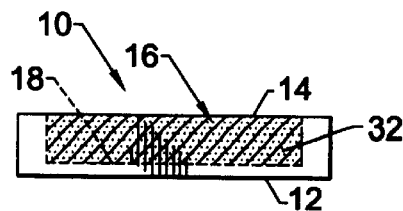
FIG. 4A.
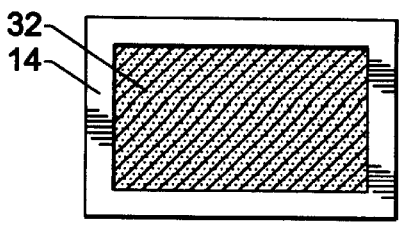
FIG. 4B.
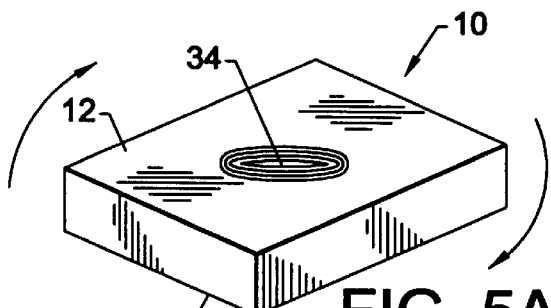
FIG. 5A.
(PRIOR ART)
FIG. 5B.
(PRIOR ART)
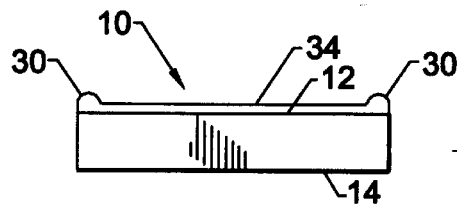
FIG. 5C.
(PRIOR ART)
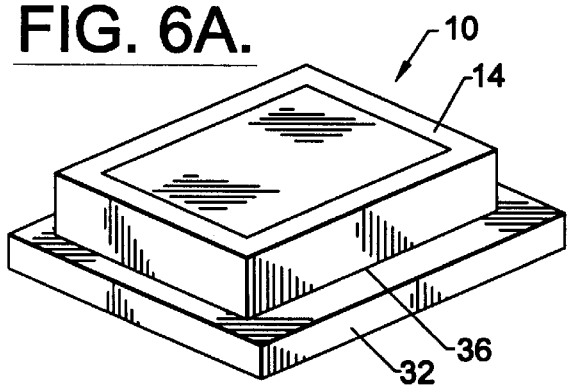
FIG. 6A.
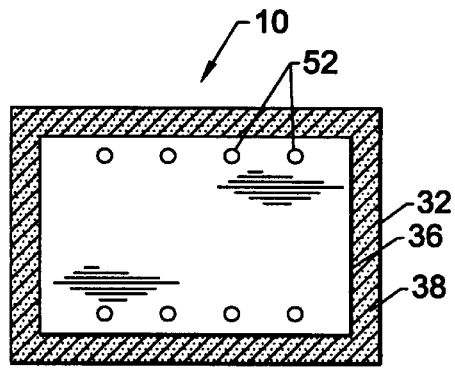
FIG. 6B.
| DEPOSITING A DESIRED AMOUNT OF MATERIAL ON THE FIRST SURFACE OF THE MICRO-ELECTRONIC SUBSTRATE — 142 |
| --- |
| ROTATING THE MICRO-ELECTRONIC SUBSTRATE UNTIL THE LAYER OF MATERIAL COVERS THE FIRST SURFACE OF THE MICRO-ELECTRONIC SUBSTRATE AND AT LEAST PARTIALLY COVERS THE SURFACE OF THE SUPPORTING MATERIAL — 144 |
FIG. 7.

METHOD FOR SUPPORTING DURING FABRICATION MECHANICAL MEMBERS OF SEMI-CONDUCTIVE DIES, WAFERS, AND DEVICES AND AN ASSOCIATED INTERMEDIATE DEVICE ASSEMBLY

FIELD OF THE INVENTION

The present invention relates to a method for manufacturing a micro-electronic device and an associated intermediate device assembly. In particular, the method provides support to mechanical members of a micro-electronic substrate such that microfabrication operations can be performed on the micro-electronic substrate without risk of fracture of the mechanical members.

BACKGROUND OF THE INVENTION

In the past few years, many micro-mechanical and micro-electromechanical devices (hereinafter collectively referred to as "MEMS devices") that include mechanical members have been fabricated from silicon or other etchable materials. These MEMS devices are advantageous because they can be made with microfabrication techniques having increased precision, allow for smaller miniaturization, and are generally lighter in weight.

The proliferation of MEMS devices having members comprised of silicon or other etchable materials has been mainly facilitated by the development of microfabrication techniques for the manufacture of integrated circuit chips. Specifically, the use of thin film processes has allowed the production of MEMS devices with submicron dimensional control. For example, micro-machines such as solid state laser and fiber optic couplings, ink jet nozzles and charge plates, gyroscopes and rotating plates, magnetic disks read/write heads, and optical recording heads can now be manufactured using silicon or other etchable materials. This use of etchable materials in manufacturing has allowed these micro-machines to be made smaller and more lightweight and with greater precision.

Although the production of MEMS devices having etched mechanical members has been expanding, several manufacturing problems have not yet been adequately addressed. For instance, unlike metallic materials, silicon and other etchable materials are generally more fragile. This characteristic of silicon and other etchable materials makes them more susceptible to fracture, especially during the manufacturing process. The delicate nature of silicon and other etchable materials is exacerbated by the fact that some MEMS devices include bladders or membranes or other mechanical members that are generally very thin. The thinness of these mechanical members coupled with the fragility of the etchable material from which they are made makes these mechanical members susceptible to fracture during the manufacturing process.

In many applications, significant processing is performed on the mechanical members. For instance, in some applications, conductive contact pads or traces are formed on the various surfaces of the micro-electronic substrate including the surface of any membrane or other mechanical member. The forming of these conductive pads or traces can subject the thin bladders, membranes or other mechanical members of the micro-electronic substrate to significant forces which may sometimes damage the membrane or other mechanical members. As such, a method is needed for manufacturing a MEMS device that includes mechanical members made of silicon or other etchable materials, which will allow for subsequent processing of the MEMS device without fear of fracturing or otherwise damaging the mechanical members.

Current techniques for manufacturing MEMS devices from silicon and other etchable materials also suffer from other problems. In this regard, many microfabrication techniques, such as photolithography, generally require a planar surface. With many current procedures for forming MEMS devices, however, a planar surface is difficult to maintain.

For instance, many etching procedures initially apply a layer of photoresist to the surface to be etched. The photoresist layer is then covered by a mask that defines regions of the photoresist that are to be exposed to light. Because light is used to expose the photoresist, it is important that the mask is in close contact with the photoresist to ensure that the pattern defined by the mask is precisely replicated upon exposure of the photoresist to light. If the photoresist layer is nonplanar, however, the mask may be have to be spaced from the photoresist layer, thereby affecting the precision to which the photoresist layer is illuminated and, in turn, developed.

One example of this problem occurs where the photoresist has been applied by use of a spinning procedure. This spinning procedure is usually accomplished by applying a desired amount of flowable photoresist on the surface of a substrate. The substrate is then rotated about an axis perpendicular to the surface of the substrate. During rotation, the flowable material is spread across the substrate by centrifugal force, and the surface of the substrate is covered with a layer of photoresist.

Although this procedure deposits a layer of photoresist on the micro-electronic substrate, the outer edges of the photoresist layer tend to define a ridge (referred to as an edge bead) due to the centrifugal force and the surface tension of the photoresist. This ridge has a greater thickness than the inner portions of the photoresist and can affect the application of the mask to the photoresist, and thereby, affect the precision of the subsequent etching procedures.

As stated previously, precise etching procedures are required for producing MEMS devices from silicon and other etchable materials. As such, a method of applying layers of material, such as photoresist, is needed that prevents the formation of ridges or edge beads on the outer edges of the material layer such that precision etching may thereafter be performed.

SUMMARY OF THE INVENTION

As set forth below, the method for applying a layer of material on a surface of a micro-electronic substrate and the associated intermediate assembly of the present invention overcome the deficiencies identified with conventional micro-electronic device manufacturing. In particular, in instances in which a MEMS device includes mechanical members, such as membranes or other structures, that require delicate handling, the method of the present invention provides a supporting structure that supports the delicate mechanical members such that the mechanical members are supported during the various etching and other manufacturing steps required to form a MEMS device. Specifically, the supporting material is formed adjacent to the membranes or other mechanical members to support the membrane or other mechanical member and to guard against fracture of the mechanical members due to flexing and other forces to which the structures are subjected during the manufacturing process.

The method and intermediate assembly of the present invention also facilitates precision etching procedures during the manufacture of the MEMS devices. For instance, the method of the present invention provides supporting material that surrounds the perimeter of the micro-electronic substrate. The supporting material is generally flush with the surface of the micro-electronic substrate such that it provides a surface that is coplanar with the surface of the micro-electronic substrate that is to be etched. This coplanar surface at least partially surrounds the perimeter of the micro-electronic substrate, and as such, provides an extended perimeter surface. When a layer of material, such as photoresist, is applied to the surface of the micro-electronic substrate and is spun to coat the surface, the material will cover the surface of the micro-electronic substrate and extend onto the surrounding surface of the supporting material. Because the photoresist extends onto the surface of the supporting material, the ridge that is formed on the edges of the spun material, due to surface tension and centrifugal force, resides on the surface of the supporting material as opposed to the surface of the micro-electronic substrate. As such, the layer of material, such as photoresist, that overlies the surface of the micro-electronic substrate is planar, and as such, promotes precision microfabrication procedures.

For example, when a mask is applied to pattern the layer of photoresist, the nonplanar ridge formed at the outer edges of the photoresist layer does not hinder the contact between the mask and photoresist over the surface of the micro-electronic substrate. Thus, the photoresist can be precisely patterned and more precise etching may thereafter be performed.

These and other advantages are provided, according to the present invention, by a method for providing support to a micro-electronic substrate that initially provides a micro-electronic substrate having first and second surfaces and defining a cavity opening through the second surface. The micro-electronic substrate further includes at least one membrane or other mechanical member that is defined by the first and second surfaces of the micro-electronic substrate. The method of the present invention further includes the step of applying a supporting material to the cavity of the micro-electronic substrate, thereby at least partially filling the cavity with the supporting material. The supporting material forms to the dimensions of the cavity of the micro-electronic substrate and supports the mechanical member of the micro-electronic substrate. By supporting the mechanical member, subsequent manufacturing processes can be performed on the micro-electronic substrate with reduced risk of fracture of the mechanical member.

In some embodiments of the present invention, it is advantageous to also provide support material about the perimeter of the micro-electronic substrate. This supporting material has a surface that is coplanar with the surface of the micro-electronic substrate that is to be further processed. In this embodiment, the surface of the supporting material surrounding the micro-electronic substrate supports the ridged edges of subsequent material layers, such as the ridged edges of a layer of photoresist, such that the layer of material that covers the surface of the micro-electronic substrate is planar. As a result, subsequent microfabrication processes, such as photolithographic and etching processes, can be more precisely performed.

Since MEMS devices have a variety of different shapes and configurations, the supporting material is advantageously selected to conform to these different shapes. As such, in some embodiments of the present invention, it is preferable to utilize a flowable or malleable supporting material to fill the cavity and to surround the perimeter of the micro-electronic device. This flowable material more readily conforms to the contours of the cavity and the outside perimeter of the micro-electronic substrate. This, in turn, ensures that the mechanical member is properly supported by the supporting material and that the supporting material properly surrounds and conforms to the perimeter of the micro-electronic substrate.

Because the supporting material is flowable or malleable in some embodiments, it is advantageous to maintain the flowable material proximate to the perimeter of the micro-electronic substrate. In these embodiments, the method of the present invention further includes the step of confining the flowable supporting material to an area adjacent to the micro-electronic substrate which not only ensures that the supporting material remains proximate to the perimeter of the micro-electronic substrate, but also allows for the buildup of the supporting material to a desired thickness around the perimeter of the substrate. To facilitate the confinement of the flowable supporting material to area adjacent to the micro-electronic substrate, at least one embodiment of the present invention includes the step of surrounding the micro-electronic substrate with a confining member or dam.

In some embodiments utilizing flowable supporting material, it is advantageous to solidify the supporting material through curing such that the workpiece may be subsequently handled with less risk of spilling or otherwise dislodging the supporting material from either the cavity or from about the perimeter of the micro-electronic substrate. Thus, the method of this embodiment of the present invention further includes the step of curing the flowable supporting material to a desired hardness prior to the step of depositing a layer of material, such as photoresist, on the first surface of the micro-electronic substrate.

As discussed above, it is advantageous to maintain a coplanar surface between the surface of the micro-electronic substrate and the supporting material surrounding the perimeter of the micro-electronic substrate. To facilitate this coplanar surface, the method can include the step of placing the first surface of the micro-electronic substrate on a work surface prior to the step of applying the supporting material to the cavity and about perimeter of the micro-electronic substrate. As such, the supporting material surrounding the perimeter of the micro-electronic substrate can contact the work surface in order to form a surface that is coplanar with the first surface of the micro-electronic substrate.

In order to prevent inconsistencies present in the work surface or foreign matter present on the work surface from disrupting the planar surface of the supporting material, it is oftentimes advantageous to position a backing sheet between the first surface of the micro-electronic substrate and the work surface such that the work surface is not in direct contact with either the first surface of the micro-electronic substrate or the supporting material. The backup sheet therefore ensures that the supporting material does not bond with the work surface and that abnormalities in the work surface or impurities present on the work surface are not transferred to the surface of the supporting material.

Furthermore, it is advantageous to ensure that the micro-electronic substrate and the confining ember, if one is utilized, remain in place while the supporting material is applied. As such, the backing sheet can include an adhesive surface which temporarily secures the micro-electronic substrate and the confining member in a desired location while the supporting material is applied about the micro-electronic substrate. Once the supporting material has been applied, the micro-electronic substrate can be removed from the backing sheet.

As discussed above, after the supporting material has been applied to the micro-electronic substrate, a layer of material, such as photoresist, is generally applied to the first surface of the micro-electronic substrate, such as by spinning. By thereafter selectively patterning the photoresist and depositing a conductive material, conductive pads or traces can be formed on the first surface of the micro-electronic substrate.

In instances in which a flowable material, such as photoresist, is spun onto the first surface of the micro-electronic substrate, the outer edges of the flowable material generally form ridges or edge beads that are thicker than inner portions of the material. To prevent the formation of ridges on the first surface of the micro-electronic substrate which could prevent precise photolithographic and other microfabrication techniques, the method of the present invention further provides for the layer of material to be deposited on the first surface of the micro-electronic substrate such that the outer edges of the layer of material reside or lie on the supporting material. As such, the layer of material which covers the first surface of the micro-electronic substrate has a planar surface to thereby facilitate subsequent microfabrication steps.

The method of the present invention also contemplates removing the ridged edge of the material layer such that only the planar inner portion of the material layer remains. This is typically accomplished by at least partially removing that portion of the supporting material that surrounds the perimeter of the micro-electronic substrate such that the outer edge of the layer of material which lies upon the supporting material is also removed. As such, the layer of material may then be precisely patterned and etched in subsequent microfabrication steps. Following the microfabrication process, the supporting material is typically removed, such as by exposing the supporting material to a reactive gas or appropriate solvent.

In addition to a method for applying a layer of material on a surface of a micro-electronic substrate, the present invention also provides a partially manufactured micro-electronic device assembly that represents an intermediate stage in the manufacture of a resulting MEMS device. The micro-electronic device assembly of this embodiment includes a micro-electronic substrate having first and second surfaces and defining a cavity opening through the second surface. Further, the micro-electronic substrate includes a membrane or other mechanical member proximate the first surface and overlying the cavity. According to the present invention, supporting material is disposed within the cavity of the micro-electronic substrate. This supporting material is adjacent to the membrane of the micro-electronic and at least partially supports the membrane of the micro-electronic substrate.

One motivation for disposing the supporting material in the cavity and about the perimeter of the micro-electronic substrate is to ensure that the micro-electronic substrate is not damaged during manufacture and to provide a planar surface adjacent the first surface of the micro-electronic substrate to support the ridged outer edges of layers of material that are subsequently applied to the micro-electronic substrate. For example, by removing the ridged edges of a photoresist layer that has been spun onto the first surface of the micro-electronic substrate by removing the supporting material that surrounds the perimeter of the micro-electronic substrate, a mask can be precisely positioned relative to the planar portion of the photoresist layer that remains so as to permit the pattern defined by the mask to be precisely transferred to the photoresist layer. Following etching, the photoresist layer will therefore precisely define the pattern of conductive pads and traces that are to be deposited on the first surface of the micro-electronic substrate. In addition, the supporting material which at least partially fills the cavity defined by the micro-electronic substrate supports the membranes or other mechanical member and prevents the membrane or other mechanical member from being fractured or otherwise damaged during the subsequent microfabrication steps.

BRIEF DESCRIPTION OF THE DRAWINGS

FIGS. 4A and 4B illustrate side and top views, respectively, of the micro-electronic substrate of FIGS. 1A–1C with supporting material deposited in the cavity of the micro-electronic substrate.

FIGS. 5A and 5B illustrate perspective views and FIG. 5C illustrates a side view of a micro-electronic substrate on which a layer of material is deposited on its first surface according to conventional techniques.

FIGS. 6A and 6B illustrate perspective and bottom views, respectively, of one embodiment of the micro-electronic substrate with supporting material surrounding the perimeter of the micro-electronic substrate.

FIG. 7 is a block representation of the operations performed to deposit a layer of material on the first surface of a micro-electronic substrate and on the surface of supporting material surrounding the substrate.

DETAILED DESCRIPTION OF THE PREFERRED EMBODIMENT

Figure 1A:
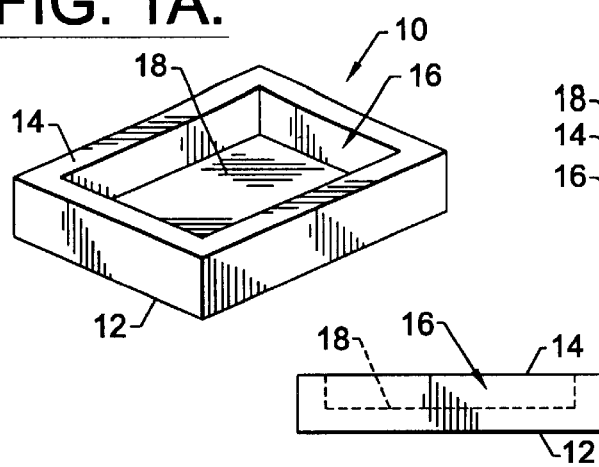
FIGS. 1A–1C illustrate perspective, top, and side views, respectively, of a micro-electronic substrate used in the method of the present invention.
Figure 1B:
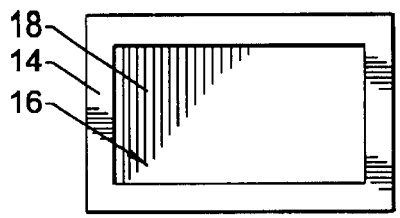
Figure 1C:
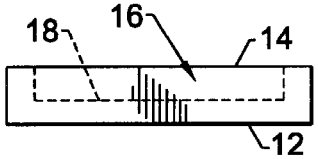

The present invention will now be described more fully hereinafter with reference to the accompanying drawings, in which a preferred embodiment of the invention is shown. This invention may, however, be embodied in many different forms and should not be construed as limited to the embodiments set forth therein; rather, this embodiment is provided so that this disclosure will be thorough and complete and will fully convey the scope of the invention to those skilled in the art. Like numbers refer to like elements throughout.

FIGS. 1A–1C and 2A–2C illustrate a pair of MEMS devices that have been fabricated from substrates formed of silicon or other etchable materials. Specifically with reference to FIGS. 1A–1C, a typical micro-electronic substrate 10 used for the manufacture of MEMS devices is shown. The micro-electronic substrate 10 includes a first surface 12 and an opposed second surface 14. The substrate also defines a cavity 16 extending through the second surface 14. Importantly, the cavity 16 defines a membrane 18 that is proximate to the first surface 12 and overlies the cavity 16. This membrane 18 is a mechanical member that will perform a mechanical or electromechanical function in the final MEMS device, such as by serving as a diaphragm or the like.

Typically, the membrane is very thin, such as less than about 10 microns. Due to the thinness of the membrane and the fragility of silicon and most other etchable materials, the membrane of the micro-electronic substrate is susceptible to fracture or damage during subsequent manufacturing operations.

Figure 2A:
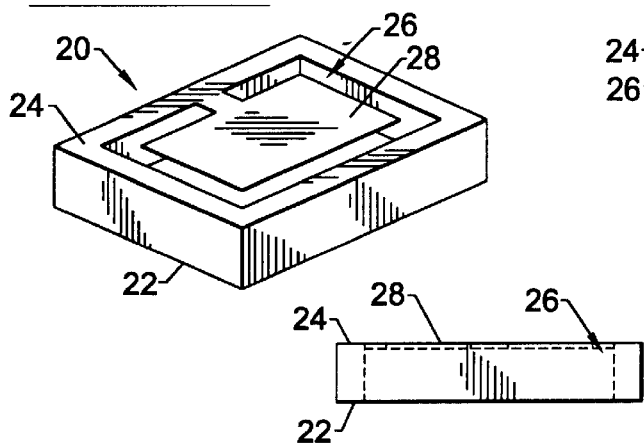
FIGS. 2A–2C illustrate perspective, top, and side views, respectively, of another embodiment of a micro-electronic substrate used in the method of the present invention.
Figure 2B:
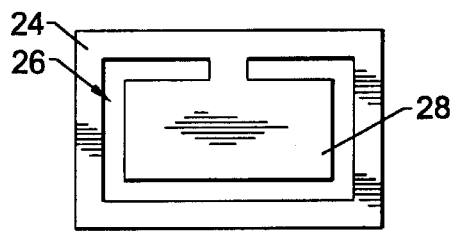
Figure 2C:
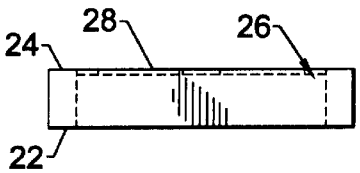

With reference to FIGS. 2A–2C, another micro-electronic substrate suitable for the manufacture of MEMS devices is shown. The micro-electronic substrate 20 also includes first 22 and second 24 surfaces and a cavity 26 defined through the second surface 24. Further, the cavity 26 and the second surface 24 define a mechanical member 28 that extends in a cantilevered fashion from surrounding portions of the substrate. This micro-electronic substrate is representative of substrates utilized in the manufacture of gyroscopes and other MEMS devices that require moveable mechanical members. As with the membrane 18 of the micro-electronic device illustrated in FIGS. 1A–1C, the mechanical member 28 of FIGS. 2A–2C is also very thin, such as less than about 10 microns, and is therefore susceptible to damage or fracture during subsequent manufacturing operations.

To remedy the problems with manufacturing MEMS devices having membranes or other mechanical members that are susceptible to fracture, the method of the present invention provides a supporting material that supports the mechanical members during the manufacture of the MEMS device. This supporting material typically abuts the mechanical members and stabilizes them such that they are not moved or flexed during subsequent manufacturing procedures, thereby preventing fracture or other types of damage.

Figure 3:
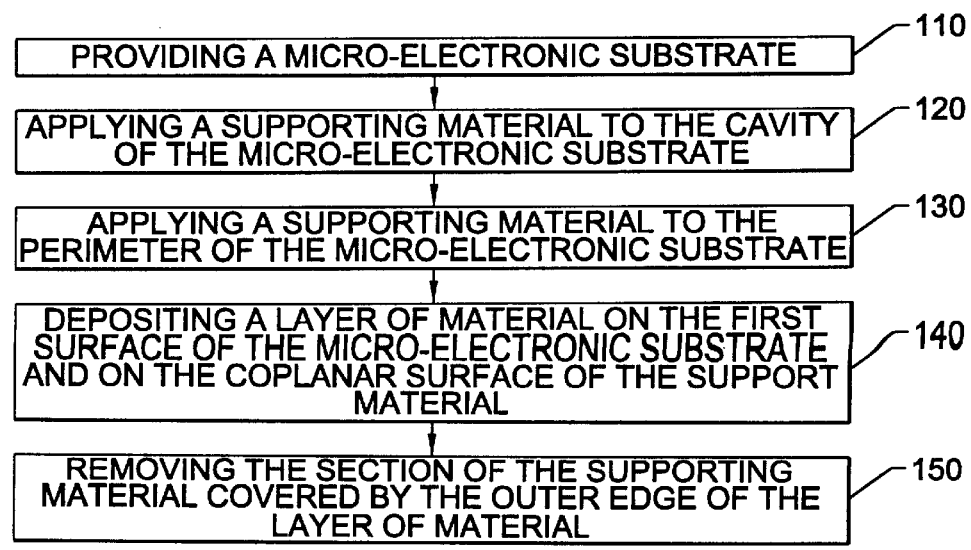
FIG. 3 is a block representation of the operations performed to apply supporting material to the cavity of a micro-electronic substrate.

With reference to FIG. 3, the method of the present invention initially includes the step of providing a micro-electronic substrate 10 similar to the micro-electronic substrates illustrated in FIGS. 1A–1C and 2A–2C. (See step 110). In particular, with reference to FIGS. 4A–4B, and as described above in conjunction with FIGS. 1A–1C, the micro-electronic substrate 10 includes first 12 and second 14 surfaces and a cavity opening 16 defined through the second surface 14. Further, the micro-electronic substrate 10 includes a membrane 18 proximate to the first surface 12 and overlying the cavity 16.

To remedy the problems associated with potential damage to the mechanical members of micro-electronic substrates, the method of the present further includes the step of applying a supporting material 32 within the cavity of the micro-electronic substrate. (See step 120). As such, the supporting material is at least partially in contact with the membrane 18 to provide support to the membrane 18, such that subsequent manufacturing processes may be performed with reduced risk of damage or fracture of the membrane 18. While only the portion of the cavity adjacent the membrane needs to be filled with the supporting material, the entire cavity is typically filled with the supporting material.

As a further example, with reference to FIGS. 2A–2C, the method of the present invention can also be used to support the cantilevered mechanical member of a micro-electronic substrate. In this embodiment, the applying step of the method of the present invention includes applying the supporting material within the cavity 26 of the micro-electronic substrate 20, to thereby back the cantilevered mechanical member 28. As such, the cantilevered mechanical member 28 is supported during subsequent manufacture of the micro-electronic substrate 20 by the supporting material.

Although MEMS devices are illustrated herein that include either membranes or cantilevered mechanical members, it is to be understood that the method of the present invention is applicable to any MEMS device which includes mechanical members. It is further to be understood that the method of the present invention may also be used with any type of semiconductive die, wafer, or device having mechanical members requiring support.

Although the method of the present invention effectively prevents the fracture of mechanical members during manufacture, conventional microfabrication techniques also sometimes encounter problems in precisely defining conductive pads or traces upon the first surface of the micro-electronic substrate as a result of imprecision in prior photolithographic procedures. These problems in the photolithographic procedures generally arise from an inability to spin a layer of photoresist onto the first surface of the micro-electronic substrate that is planar since most layers of photoresist that are spun onto a micro-electronic substrate include an outer ridge or edge (also referred to as the edge bead).

An example of the difficulties in maintaining a planar surface is shown in FIGS. 5A–5C. FIG. 5A illustrates a common method of depositing material, such as photoresist, on the surface of the micro-electronic substrate. Specifically, FIG. 5A graphically represents a method of spin coating the surface of a micro-electronic substrate, such as the micro-electronic substrate shown in FIGS. 1A–1C, with a layer of material, such as photoresist. In this method, a determined amount of flowable material 34 is placed on the first surface 12 of the micro-electronic substrate 10. The micro-electronic substrate 10 is then rotated about an axis perpendicular to the first surface until the material 34 has spread over the first surface 12 of the micro-electronic substrate 10.

Although the spin coating method described above provides a planar layer of material covering the majority of the first surface of the micro-electronic substrate, the outer edges of the layer of material are typically not planar. Specifically, with reference to FIGS. 5B and 5C, the outer edges 30 of the flowable material 34 form a nonplanar ridge of material that is thicker than the inner portions of the material 34. This ridge is generally caused by the surface tension of the flowable material 34 and the centrifugal forces from spinning the micro-electronic substrate 10. This ridge is problematic because it is non-planar relative to the remainder of the material layer 34. This non-planar ridge 30 can introduce errors during subsequent microfabrication steps, as described below.

As an example, in typical micro-electronic manufacturing operations, it is customary to apply a layer of photoresist on the surface of a micro-electronic substrate. A mask that defines regions of the photoresist that are to be illuminated is then placed over the photoresist layer. Because light is used to expose the photoresist, it is important that the mask is in close contact with the photoresist layer to ensure that the light only exposes precisely defined regions of the photoresist layer. However, the nonplanar ridges formed along the edges of the photoresist layer can disadvantageously disrupt the alignment between the photoresist layer and the mask, thereby decreasing the precision with which the photolithographic layer can be patterned and, in turn, the precision with which the photolithographic layer can be etched and conductive traces or pads can be deposited upon the first surface of the micro-electronic substrate.

The method of the present invention also eliminates the problems identified in FIGS. 5B and 5C associated with applying layers of material on micro-electronic substrates. Specifically, with reference to FIG. 3, the method of the present invention further includes the step of applying supporting material about the perimeter of the micro-electronic substrate. (See step 130). In particular, with reference to FIGS. 6A and 6B, the method of the embodiment of the present applies the supporting material 32 around the perimeter 36 of the micro-electronic substrate 10 such that a surface 38 of the supporting material 32 is coplanar with the first surface 12 of the micro-electronic substrate 10.

The addition of the supporting material about the perimeter of the micro-electronic substrate facilitates the planar application of materials to the first surface of the micro-electronic substrate. Specifically, the surface of the supporting material that is coplanar with the first surface of the micro-electronic substrate provides an area on which the ridged outer edges of the layer of material, such as photoresist, can reside or lie. As such, the nonplanar ridge is remote or removed from the first surface of the micro-electronic substrate such that the layer of material that covers the first surface of the micro-electronic substrate is planar, thereby facilitating subsequent photolithographic or other microfabrication steps to be performed by a precise manner.

Figure 8A:
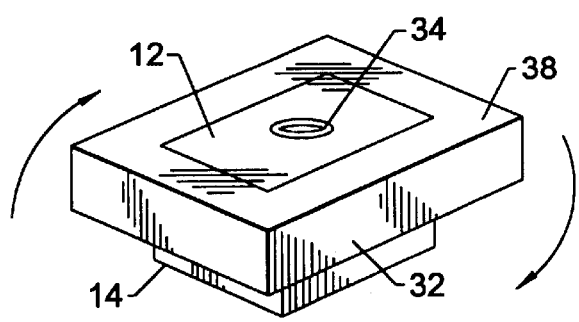
FIGS. 8A and 8B illustrate sequential perspective views during the application of a layer of material on the first surface of a micro-electronic substrate and the surface of supporting material surrounding the substrate.

Specifically, with reference to FIG. 3, the method of the present invention further provides depositing a layer of material 34 on the first surface 12 of the micro-electronic substrate 10 and at least a portion of the surface 38 of the supporting material 32 that is coplanar with the first surface 12 of the micro-electronic substrate 10. (See step 140). Although this method may be performed by many different procedures, one advantageous procedure utilizes the spin coating method as disclosed above. In particular with reference to FIGS. 7, 8A and 8B, a desired amount of the material 34, such as photoresist, is first deposited on the first surface 12 of the micro-electronic substrate 10. (See step 142). The micro-electronic substrate 10 is then rotated about an axis perpendicular to the first surface of the micro-electronic substrate until the material 34 has spread over the first surface 12 of the micro-electronic substrate 10 and the surface 38 of the supporting material 34. (See step 144). As such, the layer of material 34 substantially covers the first surface 12 of the micro-electronic substrate 10 and edge portions 30 of the layer of material 34 reside or lie upon the supporting material, thereby permitting the layer of material 34 that substantially covers the first surface 12 of the micro-electronic substrate 10 to be planar. Additional layers can then be sequentially coated (i.e., multiple coatings) for a thick photoresist total thickness.

Figure 8B:
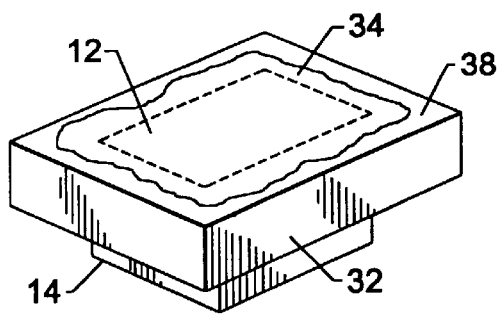

As illustrated in FIG. 8B, the addition of the supporting material about the perimeter of the micro-electronic substrate facilitates the planar application of material to the first surface of the micro-electronic substrate, such that subsequent microfabrication steps can be precisely performed. Specifically, since the ridged edges of the layer of material are remote from the first surface of the micro-electronic substrate, a mask can be precisely positioned upon the layer of the material during subsequent photolithographic operations. Accordingly, the photoresist layer can be illuminated in precisely the pattern defined by the mask.

In some embodiments of the present invention, it is advantageous to remove the supporting material that surrounds the micro-electronic substrate and that supports the ridged edge. With reference to FIGS. 3 and 8B, the method of this embodiment of the present invention further provides for removing at least a portion and, more preferably, all of the supporting material 32 that surrounds the micro-electronic substrate such that the outer edge 30 of the layer of material 34 is removed. (See step 150). In this manner, the nonplanar portions of the layer of material are removed such that the remainder of the material layer is planar, thereby facilitating subsequent microfabrication operations.

As discussed above, the method of the present invention provides both a method for supporting the mechanical members of a micro-electronic substrate and a method for facilitating the planar application of a layer of material upon the first surface of the micro-electronic substrate. Although these two methods may be used independently, both techniques are oftentimes performed on a micro-electronic substrate such that the mechanical members are not only supported, but a planar layer of material is applied for facilitating subsequent manufacturing procedures.

Figure 9A:
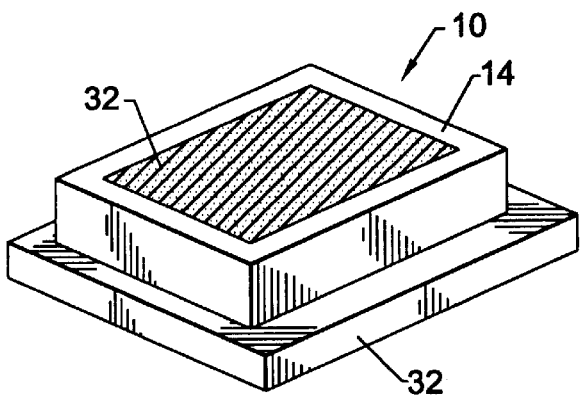
FIGS. 9A and 9B illustrate two embodiments of the micro-electronic substrate of the present invention with supporting material disposed in the cavity and about the perimeter of the micro-electronic substrate and FIG. 9C illustrates the bottom view for both embodiments.
Figure 9B:
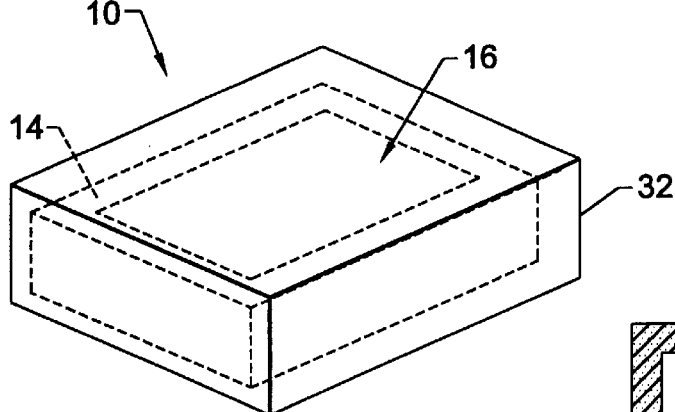
Figure 9C:
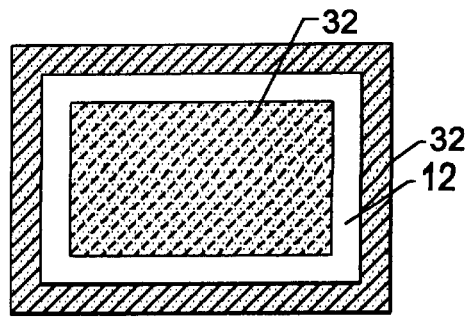

FIGS. 9A and 9B represent two embodiments in which supporting material 32 is applied to both the cavity 16 of the micro-electronic substrate 10 and about the perimeter 36 of the micro-electronic substrate 10. (See steps 120 and 130). Specifically, with reference to FIG. 9A, the supporting material 32 is disposed in the cavity 16 of the micro-electronic substrate 10. Further, with reference to FIG. 9C which is a bottom view of the micro-electronic substrate of FIG. 9A, the supporting material 32 is also applied around the perimeter 36 of the micro-electronic substrate 10 so as to have a surface that is coplanar with the first surface 12 of the micro-electronic substrate 10. As such, the method of the present invention not only provides support for the membrane of the micro-electronic substrate but also facilitates the planar application of additional material layers upon the first surface of the micro-electronic substrate.

With reference to FIG. 9B another embodiment of the present invention is illustrated. In this embodiment, the supporting material 32 not only fills the cavity 16 of the micro-electronic substrate 10 and surrounds the perimeter 36 of the micro-electronic substrate 10, but it also surrounds the entire second surface 14 of the micro-electronic substrate 10. In this embodiment, the supporting material provides protection for the membrane 18 and also provides a surface 38 that is coplanar with the first surface 12 of the micro-electronic substrate 10. (See FIG. 9C). Further, the supporting material reduces the risk of damage to the second surface of the micro-electronic substrate during the manufacturing process. Also, because the supporting material surrounds the perimeter and second surface of the substrate, the micro-electronic substrate may be more easily grasped and handled.

As discussed above, the method of the present invention involves the application of supporting material in the cavity and around the perimeter of a micro-electronic substrate. As the basic function of the supporting material is to support the mechanical member and to provide a coplanar surface, many different types of materials may be used. For instance, pliable or malleable materials such as organic materials (polyimide, spin on glass (SOG), waxes, etc.), inorganic materials, and any other type of sacrificial temporary removable materials may be used. Further, the material may consist of a material, such as paraffin wax, that has a relatively low melting point such that the material may be at least partially melted and then applied to the micro-electronic substrate.

In addition to the use of many different types of supporting material, there are also many methods for applying the supporting material to the micro-electronic substrate. For illustrative purposes, two of these methods are detailed below. In one embodiment of the method of the present invention, a work surface is utilized for applying the supporting material to the micro-electronic substrate. The work surface provides a rigid surface on which to place the micro-electronic substrate. Further, the work surface provides a planar surface on which to apply the supporting material, thereby facilitating alignment of a surface of supporting material with the first surface of the micro-electronic substrate.

Figure 10:
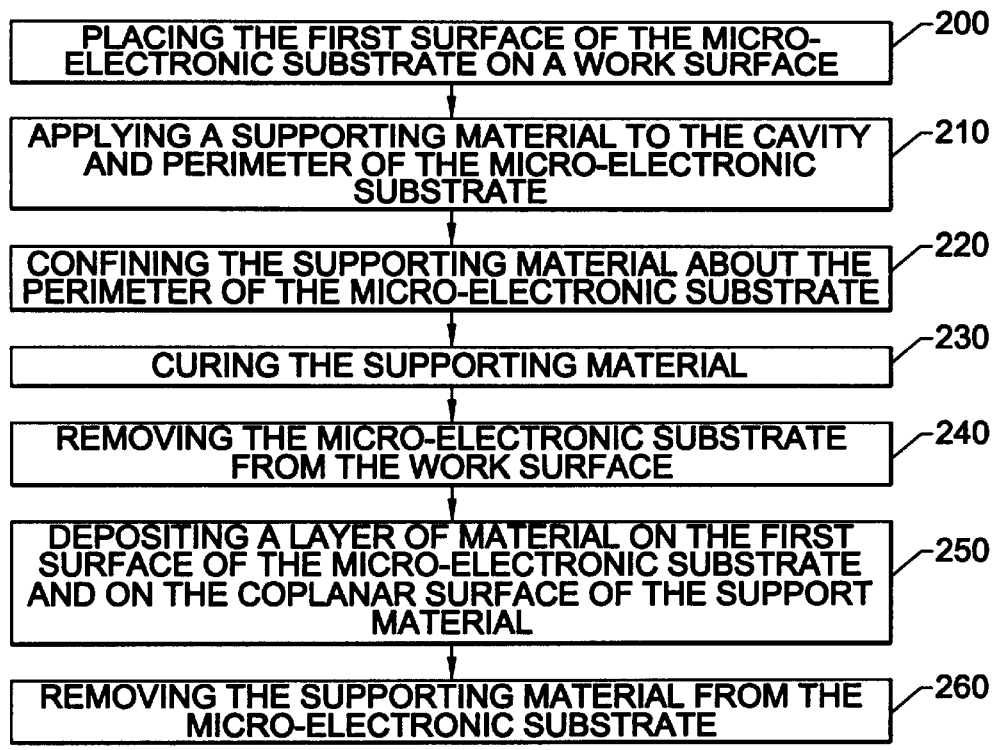
FIG. 10 is a block representation of the operations performed to apply supporting material in the cavity and around the perimeter of a micro-electronic substrate according to one embodiment of the invention.
Figure 11A:
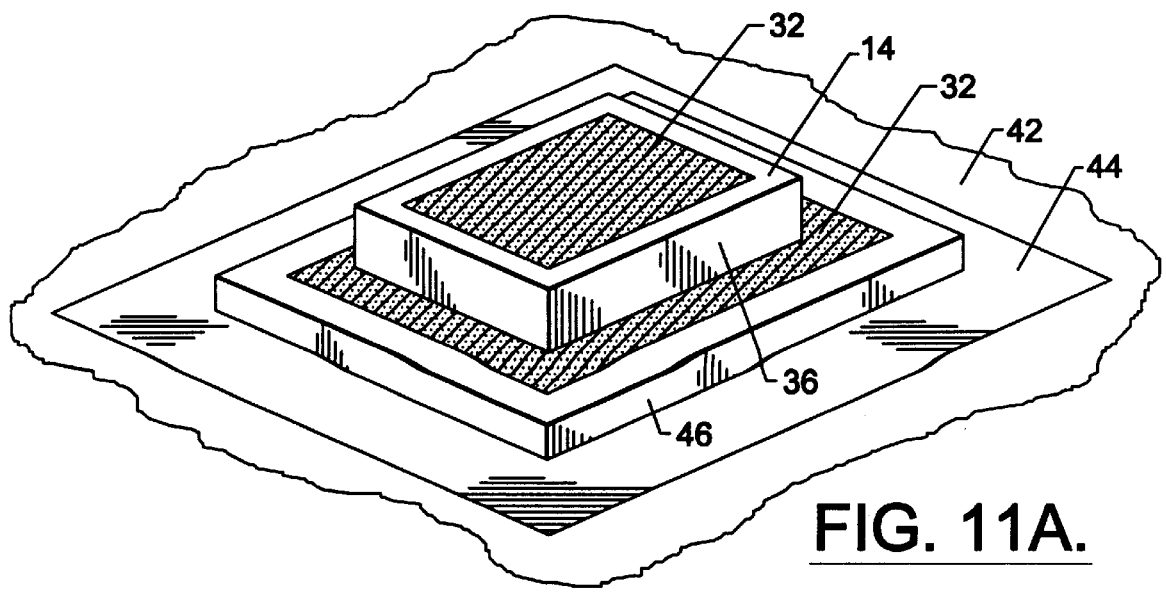
FIGS. 11A and 11B illustrate perspective and top views, respectively, of the micro-electronic substrate of one embodiment resting on a work surface and surrounded by a confining member according to another embodiment of the present invention.
Figure 11B:
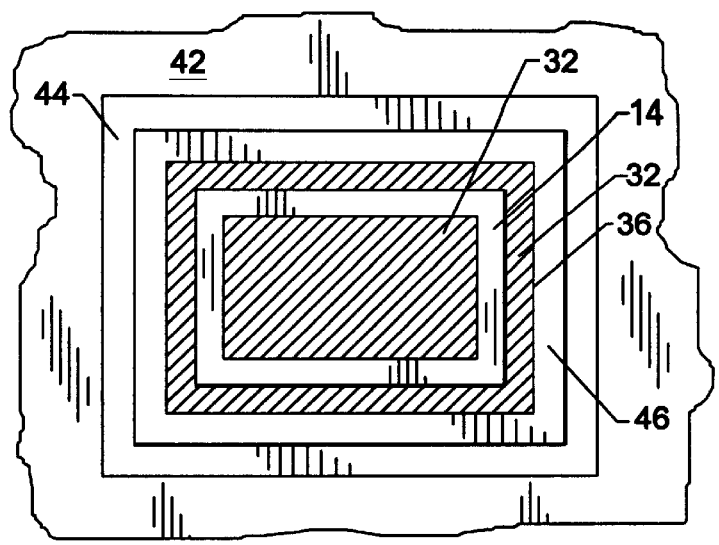

Specifically, with reference to FIGS. 10, 11A, and 11B, the method of this embodiment includes the step of placing the first surface 12 of the micro-electronic substrate 10 on a work surface 42. (See step 200). Further, the method comprises the step of applying a supporting material 32 to the cavity 16 of the micro-electronic substrate 10 and about the perimeter 36 of the micro-electronic substrate 10, such that a portion of the supporting material 32 is in contact with the work surface 42. (See step 210). The contact between the supporting material 32 and the work surface 42 forms a surface 38 of the supporting material 32 that is coplanar with the first surface 12 of the micro-electronic substrate 10.

After the supporting material 32 has been applied to the micro-electronic substrate 10, the method of the present invention further includes the step of removing the micro-electronic substrate 10 and the supporting material 32 from the work surface 42, such that subsequent manufacturing processes may be performed on the micro-electronic substrate 10. (See step 240). In particular, the method of the present invention further comprises the step of depositing a layer of material 34 on the first surface 12 of the micro-electronic substrate 10 and at least a portion of the surface 38 of the supporting material 32 that is coplanar with the first surface 12 of the micro-electronic substrate 10. (See step 250). As detailed previously, the depositing step comprises depositing the layer of material 34 such that the layer of material 34 substantially covers the first surface 12 of the micro-electronic substrate 10 and edge portions 30 of the layer of material 34 reside or lie upon the supporting material 32.

As a coplanar supporting surface is usually desired for subsequent manufacturing processes, it is sometimes important to prevent either inconsistencies present in the work surface or foreign matter present on the work surface from introducing irregularities in the surface of the supporting material. Thus, in some embodiments, the method of the present invention can place a backing sheet 44 upon the work surface 42 prior to placing the micro-electronic substrate upon the work surface such that the backing sheet is between the first surface 12 of the micro-electronic substrate 10 and the work surface 42, thereby preventing direct contact by the work surface with either the first surface 12 of the micro-electronic substrate 10 or the surface 38 of the supporting material 32. (See step 200). This ensures that the supporting material does not bond with the work surface or that abnormalities in the work surface or impurities present on the work surface are not transferred to the surface of the supporting material. As such, a coplanar relationship between the first surface of the micro-electronic substrate and the surface of the supporting material is maintained. This backing sheet may consist of many types of material including paper, plastic, wood, or metal. In one embodiment, however, the backing sheet is formed of SARAN-WRAP® or REYNOLDS-WRAP® plastic wrap.

As discussed, an important aspect of the supporting material is to provide support to the mechanical members of the micro-electronic substrate and also to provide a surface coplanar with the first surface of the micro-electronic substrate. As shown in FIGS. 1A–1C and 2A–2C, however, micro-electronic substrates may assume many different forms and have several different configurations. As such, procedures are needed to ensure that the supporting material is properly applied to the micro-electronic substrate.

This problem is remedied in one embodiment of the present invention by applying a flowable supporting material to the micro-electronic substrate. (See step 210). The use of flowable materials allows the support material to easily conform to these different configurations without having to provide a differently shaped support material for each different micro-electronic substrate.

Although many different types of materials may be used in this embodiment, it is preferred that a material be used that is readily transformable to a flowable state. For instance in some embodiments of the present invention a wax material, such as paraffin wax, is utilized as a supporting material. The wax typically has a low melting point and can be readily transformed into a flowable liquid.

Because flowable supporting material is utilized in these embodiments, it is sometimes advantageous to confine the supporting material about the perimeter of the micro-electronic substrate. As such, with reference to FIGS. 10, 11A, and 11B, one embodiment of the present invention further comprises the step of confining (See step 220) the supporting material by placing a confining member or dam 46, such as a strip of rubber or the like, about the perimeter 36 of the micro-electronic substrate 10 in a spaced apart relationship. Since the supporting material which surrounds the micro-electronic substrate preferably has a width of at least one-eighth (⅛) to one-quarter (¼) inch, the confining member or dam is preferably spaced by at least one-quarter (¼) inch from the micro-electronic substrate. The confining member 46 confines the flowable supporting material 32 to an area adjacent to the micro-electronic substrate 10 such that the flowable supporting material 32 is disposed about the perimeter 36 of the micro-electronic substrate 10. The height of the confining member also defines the maximum thickness of the supporting material that surrounds the perimeter of the micro-electronic substrate.

As will be apparent, the application of a flowable supporting material subjects the micro-electronic substrate and the confining member to forces that may disadvantageously shift their relative positions. As such, a backing sheet 44 can include an adhesive surface 48 that is oriented to face the micro-electronic substrate. (See step 200). The first surface 12 of the micro-electronic substrate 10 is then placed on the adhesive surface 48 of the backing sheet 44 and the confining member 46 is also placed on the adhesive surface 48 of the backing sheet 44. As such, the micro-electronic substrate 10 and the confining member 46 remain in the desired locations while the supporting material 32 is applied to the micro-electronic substrate.

The adhesive surface of the backing sheet may be of any particular adhesive material. However, a weak adhesive is preferred to ensure that the micro-electronic substrate is not damaged when the backing sheet is removed. As one example of an adhesive, a layer of photoresist applied to the surface of the backing sheet will act as a weak adhesive for holding the micro-electronic substrate and the confining member in place.

As discussed, one of the main reasons for applying the supporting material is to support the mechanical member during subsequent manufacturing operations. As such, after the supporting material has been applied within the cavity and about the perimeter of the micro-electronic substrate, a layer of material, such as photoresist, is typically deposited on the first surface of the micro-electronic device. In order to deposit the layer of material on the first surface of the micro-electronic substrate, the micro-electronic substrate must first be removed from the backing sheet. Therefore, in embodiments in which the first surface of the micro-electronic substrate is placed on a work surface or on a backing sheet, the method of the present invention further comprises the step of removing the micro-electronic substrate 10 from the work surface 42 or the backing sheet 44 prior to depositing the material on the first surface of the micro-electronic substrate. (See step 250).

Figure 12:
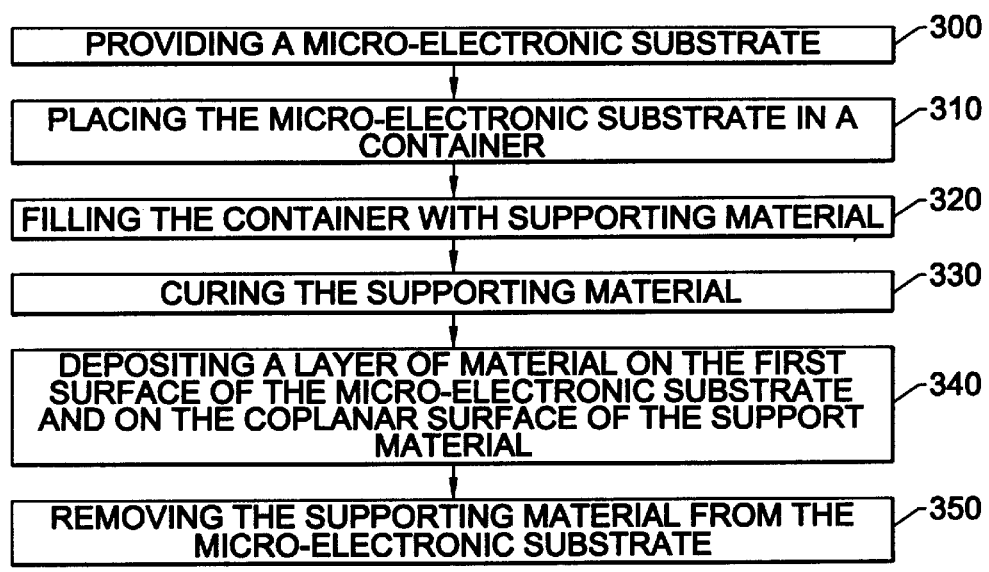
FIG. 12 is a block representation of the operations performed to apply supporting material in the cavity and around the perimeter of a micro-electronic substrate according to another embodiment of the invention.
Figure 13:
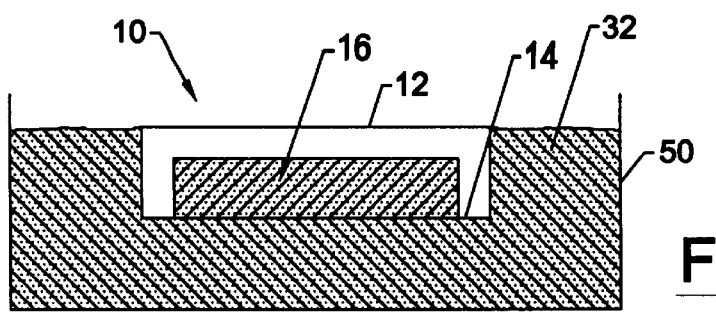
FIG. 13 illustrates a side view of a micro-electronic substrate disposed in a container for application of supporting material in the cavity and around the perimeter of the substrate.

With reference to FIGS. 12 and 13, another method of applying supporting material to the micro-electronic substrate is shown. As described above in conjunction with the method detailed above which utilizes a work surface to apply the supporting material, the method of this embodiment initially provides a micro-electronic substrate 10 similar to the micro-electronic substrates illustrated in FIGS. 1A–1C and 2A–2C. (See step 300). In particular, with reference to FIG. 13, the micro-electronic substrate 10 includes first 12 and second 14 surfaces and a cavity 16 opening through the second surface 14. Further, the micro-electronic substrate 10 includes a membrane 18 proximate to the first surface 12 and overlying the cavity 16.

The method of the present invention then places the micro-electronic substrate in a container 50 such that the first surface 12 of the micro-electronic substrate 10 is facing upwardly in a direction out of the container. (See step 310). The container 44 is then filled with flowable supporting material 32, such as molten wax, such that the cavity is filled with the supporting material. (See step 320). The filling step further comprises filling the container and simultaneously holding the micro-electronic substrate within the container until the surface 38 of the supporting material 32 is coplanar with the first surface 12 of the supporting material 32.

Because the above methods of applying supporting material to the micro-electronic substrate involve the use of flowable supporting material, it is advantageous to then cure the supporting material to a desired hardness, such as by allowing a predetermined length of time to pass. (See steps 230 and 330). As such, the micro-electronic substrate can then be grasped and handled without the risk of disturbing the supporting material.

As mentioned previously, the addition of the supporting material is to provide support to the mechanical members and a coplanar perimeter surface for the micro-electronic substrate. Although it is contemplated that the supporting material may remain intact after the manufacture of the MEMS device, in most instances it is necessary to remove the supporting material from the micro-electronic substrate either after the device has been manufactured or some time later during the manufacturing procedures. (See steps 260 and 350). Specifically, the method of this embodiment further includes the step of removing the supporting material 32 from the micro-electronic substrate 10. Because the supporting material may consist of many different types of materials, the step of removing the supporting material may be accomplished in a number of different manners.

For instance, where the supporting material has a low melting point, the supporting material may be removed by heating the supporting material above the melting point and then draining the supporting material from the micro-electronic substrate. However, in some embodiments, it may be undesirable to heat the micro-electronic substrate. In these instances, the method of the present invention may utilize a dry gas etching procedure to remove the supporting material from the micro-electronic substrate. Dry gas etching procedures are commonly known and involve subjecting the supporting material to an appropriate reactive gas or mixed gas mixture depending on the composition of the supporting material. Some examples of reactive gasses are oxygen, $CF_4$, trichloroethylene or any other reactive gas or gas mixture which will effectively dissolve the supporting material. The use of dry gas etching procedures is advantageous as it is generally less intrusive and less harmful to the resulting micro-electronic substrate.

In addition to providing a method for applying a layer of material on a surface of a micro-electronic substrate, the present invention also provides a partially manufactured micro-electronic device assembly. This device assembly represents the micro-electronic substrate in an intermediate stage of manufacture in which the micro-electronic device is partially encased with supporting material that supports the mechanical members of the micro-electronic substrate, as described above.

Specifically, with reference to FIGS. 4A and 4B, the partially manufactured micro-electronic device assembly of the present invention includes a micro-electronic substrate 10 having first 12 and second 14 surfaces and a cavity 16 opening through the second surface 14. The micro-electronic substrate further includes a membrane 18 or other mechanical member proximate to the first surface 12 and overlying the cavity 16. The partially fabricated micro-electronic device also includes supporting material, such as wax, disposed in the cavity 16 of the micro-electronic substrate 10 adjacent to the membrane 18. The supporting material at least partially supports the membrane of the micro-electronic substrate.

As discussed above, with reference to FIGS. 6A and 6B, it may also be advantageous to provide supporting material about the perimeter of the micro-electronic substrate. In this embodiment of the present invention, the partially fabricated micro-electronic device further includes supporting material 32 about at least a portion of the perimeter 36 of the micro-electronic substrate 10 such that a surface 38 of the supporting material 32 is coplanar with the first surface 12 of the micro-electronic substrate 10. By appropriately depositing and patterning a photoresist layer upon the first surface of the micro-electronic substrate, precisely defined electrical pads 52 or traces or interconnect columns/bumps can also be formed upon the first surface of the micro-electronic substrate.

In the drawings and the specification, there has been set forth a preferred embodiment of the invention and, although specific terms are employed, the terms are used in a generic and descriptive sense only and not for purpose of limitation, the scope of the invention being set forth in the following claims.

What is claimed is:

1. A method for applying a layer of material on a surface of a micro-electronic substrate, wherein said method comprises the steps of:

providing a micro-electronic substrate having first and second surfaces and defining a cavity opening through the second surface, wherein the micro-electronic substrate includes a membrane proximate to the first surface and overlying the cavity;

applying a supporting material within the cavity of said micro-electronic substrate and about at least a portion of the perimeter of the micro-electronic substrate, wherein said applying step comprises applying the supporting material such that a surface of the supporting material is coplanar with the first surface of the micro-electronic substrate; and depositing the layer of material on said first surface of said micro-electronic substrate and at least a portion of the surface of the supporting material that is coplanar with the first surface of the micro-electronic substrate such that said layer of material substantially covers said first surface of said micro-electronic substrate and edge portions of the layer of material reside upon said supporting material, thereby permitting the layer of material substantially covering the first surface of the substrate to have a planar surface.

2. A method according to claim 1, wherein said applying step comprises applying a supporting material about the entire perimeter of the micro-electronic substrate.

3. A method according to claim 1, wherein said applying step comprises substantially filling the cavity of said micro-electronic substrate with the supporting material.

4. A method according to claim 1, wherein said applying step comprises applying a flowable supporting material to the cavity and about at least a portion of the perimeter of the micro-electronic substrate.

5. A method according to claim 4 further comprising the step of confining the flowable supporting material to an area adjacent to the perimeter of said micro-electronic substrate such that the flowable supporting material remains adjacent to the perimeter of the micro-electronic substrate.

6. A method according to claim 5, wherein said confining step comprises at least partially surrounding said micro-electronic substrate with a confining member for confining said flowable support material to an area between the confining member and the perimeter of said micro-electronic substrate.

7. A method according to claim 4 further comprising the step of curing the flowable supporting material to a desired hardness prior to the step of depositing the layer of material on said first surface of said micro-electronic substrate and the surface of the supporting material.

8. A method according to claim 1 further comprising the step of placing the first surface of the micro-electronic substrate on a work surface prior to the step of applying the supporting material to the cavity and about the perimeter of the micro-electronic substrate, wherein said applying step comprises applying the supporting material to the cavity of the micro-electronic substrate and about at least a portion of the perimeter of the micro-electronic substrate such that a portion of the supporting material is in contact with the work surface, thereby forming a surface of the supporting material that is coplanar with the first surface of the micro-electronic substrate.

9. A method according to claim 8 further comprising the step of removing the micro-electronic substrate and the supporting material from the work surface prior to the step of depositing the layer of material on said first surface of said micro-electronic substrate and the surface of the supporting material.

10. A method according to claim 8, wherein said placing step comprises:

placing a backing sheet on the work surface; and placing the first surface of the micro-electronic device on said backing sheet.

11. A method according to claim 10 further comprising the step of removing the micro-electronic substrate and the supporting material from the backing sheet prior to the step of depositing the layer of material on said first surface of said micro-electronic substrate and the surface of the supporting material.

12. A method according to claim 10, wherein the backing sheet includes an adhesive surface opposite said work surface, wherein said applying step comprises applying a flowable supporting material to the cavity of the micro-electronic substrate and about at least a portion of the perimeter of the micro-electronic substrate such that a portion of the flowable supporting material is in contact with the adhesive surface of the backing sheet, thereby forming a surface of the supporting material that is coplanar with the first surface of the micro-electronic substrate.

13. A method according to claim 1, wherein said depositing step comprises:

depositing a desired amount of material on said first surface of said micro-electronic substrate; and rotating said micro-electronic substrate about an axis perpendicular to said first surface such that said material spreads across the first surface of said micro-electronic substrate and the surface of the supporting material that is coplanar with the first surface of the micro-electronic substrate such that said layer of material substantially covers said first surface of said micro-electronic substrate and edge portions of the layer of material reside upon the surface of said supporting material, thereby permitting the layer of material substantially covering the first surface of the substrate to have a planar surface.

14. A method according to claim 13 further comprising the step of removing at least a portion of the supporting substrate covered by said layer of material such that the outer edge of said flowable layer of material is also removed.

15. A method according to claim 13 further comprising the step of at least partially curing said flowable layer of material after said depositing step.

16. A method according to claim 1 further comprising the step of removing said supporting material from said micro-electronic substrate after said depositing step.

17. A method for providing support to a micro-electronic substrate, wherein said method comprises the steps of:

providing a micro-electronic substrate having first and second surfaces and defining a cavity opening through the second surface, wherein the micro-electronic substrate includes at least one mechanical member proximate the first surface of the micro-electronic substrate;

applying a supporting material within the cavity of said micro-electronic substrate, wherein said applying step comprises at least partially filling the cavity of said substrate with the supporting material such that said supporting material at least partially supports said mechanical member of said micro-electronic substrate; and forming contact pads on the first surface of said microelectronic substrate.

18. A method according to claim 17 further comprising the step of removing said supporting material from said micro-electronic substrate after said depositing step.

19. A method according to claim 18, wherein said step of removing said supporting material comprises exposing said supporting material to a reactive gas such that said reactive gas dissolves said supporting material.

20. A method according to claim 18, wherein said step of removing said supporting material comprises exposing said supporting material to a solvent such that said solvent dissolves said supporting material.

21. A method according to claim 18, wherein said step of removing said supporting material comprises exposing said supporting material to a heat source, wherein heat from said heat source melts said supporting material such that said supporting material may be removed from said micro-electronic substrate.

* * * * *